United States Patent
Vu et al.

(10) Patent No.: US 6,173,216 B1
(45) Date of Patent: Jan. 9, 2001

(54) PROTECTIVE RELAY WITH IMPROVED, SUB-WINDOW COSINE FILTER

(75) Inventors: Khoi Vu, Apex; David G. Hart, Raleigh; Damir Novosel, Cary, all of NC (US)

(73) Assignee: ABB Power T&D Company Inc., Raleigh, NC (US)

(*) Notice: Under 35 U.S.C. 154(b), the term of this patent shall be extended for 0 days.

(21) Appl. No.: 09/060,508

(22) Filed: Apr. 15, 1998

(51) Int. Cl.$^7$ .............................. H02J 1/14; H02J 17/00; H02H 7/00; H02H 9/00

(52) U.S. Cl. ..................... 700/294; 700/292; 700/293; 700/297; 700/298; 702/59; 702/64; 702/66; 702/72; 702/77; 361/80; 361/86; 361/88

(58) Field of Search ...................... 700/286, 292, 700/293, 294, 297, 298; 702/59, 64, 66, 72, 77; 361/80, 86, 88

(56) References Cited

U.S. PATENT DOCUMENTS

| | | | |
|---|---|---|---|
| 5,172,329 | 12/1992 | Rahman et al. | 364/483 |
| 5,343,404 * | 8/1994 | Girgis | 364/484 |
| 5,406,495 * | 4/1995 | Hill | 364/487 |
| 5,428,549 * | 6/1995 | Chen | 702/59 |
| 5,453,903 * | 9/1995 | Chow | 361/79 |
| 5,537,327 * | 7/1996 | Snow et al. | 700/293 |
| 5,592,393 * | 1/1997 | Yalla | 700/292 |
| 5,671,112 * | 9/1997 | Hu et al. | 361/86 |
| 5,796,629 * | 8/1998 | Calero et al. | 700/292 |
| 5,909,656 * | 6/1999 | Yang | 702/77 |
| 5,995,911 * | 11/1999 | Hart | 702/64 |

OTHER PUBLICATIONS

Schweitzer, III, et al., "Filtering for Protective Relays", 19th Annual Western Protective Relay Conference, Spokane, Washington, Oct. 20–22, 1992, 1–24.

Zegarra, "Microprocessor–Based Time–Overcurrent Relay: Development, Simulation, Design and Testing", A Thesis Presented to the Faculty of the Graduate College of Ohio University, Jun., 1979, 1–145.

* cited by examiner

Primary Examiner—Ayaz R. Sheikh
Assistant Examiner—Frantz Blanchard Jean
(74) Attorney, Agent, or Firm—Woodcock Washburn Kurtz Mackiewicz & Norris LLP

(57) ABSTRACT

As a variation of the non-orthogonal filter, a phasor estimate is computed by using an N-point window. An aspect of the sub-window cosine filter is to repeat the basic cosine filter for only selected points of the window. In the end, a least-squares fit is used to obtain an estimate for the phasors components. Previous cosine techniques use a data window whose length is greater than 1 cycle while the present invention requires only 1 cycle.

6 Claims, 2 Drawing Sheets

PROTECTIVE RELAY WITH IMPROVED, SUB-WINDOW COSINE FILTER

CROSS REFERENCE

The present invention is related to the subject matter disclosed in application Ser. No. 09/060,458 filed on Apr. 15, 1998, titled "Modified Cosine Filters".

FIELD OF THE INVENTION

The present invention relates generally to protective relaying, and more particularly to a microprocessor- or DSP-based protective relay with an improved cosine filter function.

BACKGROUND OF THE INVENTION

Electrical transmission lines and power generation equipment must be protected against faults and consequent short circuits, which can cause a collapse of the power system, equipment damage, and personal injury. It is the function of the protective relays, which monitor AC voltages and currents, to locate line faults and initiate isolation by the tripping of circuit breakers. Protective relays generally perform one or more of the following functions: (a) monitoring the system to ascertain whether it is in a normal or abnormal state; (b) metering, which involves measuring certain electrical quantities for operational control; (c) protection, which typically involves tripping a circuit breaker in response to the detection of a short-circuit condition; and (d) alarming, which provides a warning of some impending problem. Fault location, e.g., is associated with the protection function and involves measuring critical system parameters and, when a fault occurs, quickly making a rough estimate of the fault location and of certain characteristics of the fault so that the power source can be isolated from the faulted line. Thereafter, the system makes a comprehensive evaluation of the nature of the fault.

Modern protective relays employ microprocessors and/or digital signal processors (DSPS) to process the voltage and current waveforms measured on the protected transmission line (the term "transmission line" as employed herein is intended to cover any type of electrical conductor, including high power conductors, feeders, and transformer windings). Such processing may include the computation of a DFT. For example, U.S. Pat. No. 5,592,393, Jan. 7, 1997, titled "Method and System for Providing Protective Relay Functions," describes a system that uses the DFT function to compute instantaneous values of fundamental, second harmonic and fifth harmonic components. U.S. Pat. No. 5,172,329, Dec. 15, 1992, "Microprocessor Digital Protective Relay for Power Transformers," describes a system that uses the DFT function to compute voltage and current phasors.

The conventional DFT exhibits poor performance if the input signal contains a decaying DC component having a continuous frequency spectrum. Therefore, the DC signal component, or offset, is typically filtered out of the input signal before the DFT function is carried out. There are a number of the methods to deal with such DC offset, including the use of (1) a digital mimic circuit, (2) half-cycle and full-cycle compensation, (3) a parallel filter, and (4) a cosine filter. However, certain problems are associated with each of these methods. U.S. patent application Ser. No. 08/811,646, filed Mar. 5, 1997, "Protective Relay With Improved DFT Function," discloses an improved DFT function in which the decaying DC components are subtracted from the normal current and voltage phasors to yield modified phasors that are free of the effects of the decaying DC components. The present invention is directed to an alternative approach involving the use of an improved cosine filter.

Since distance relaying involves the use of voltage and current phasors to determine whether a fault is in the protected zone, it is imperative that the phasor estimates be as accurate as possible. The voltage signal may contain high-frequency components that can be filtered using an anti-aliasing filter and through least squares methods such as the DFT. However, the current may contain a decaying DC component what will cause the DFT to erroneously calculate the current phasor. The current phasor estimate will typically be inflated; therefore, the ratio of the voltage to the current will yield a small impedance value, causing the relay to trip when the fault is actually beyond the relay setting. This phenomenon is known as relay over-reach since the relay reaches beyond the setting and trips. Those skilled in the art recognize that the cosine filter provides one mechanism for removing the DC component of the current and thereby improving the current phasor estimate. Unlike the DFT, the cosine filter estimates only the cosine component of the current signal. The complete DFT is obtained by using two estimates shifted by 90 degrees, yielding the cosine and sine components. The cosine filter has been demonstrated for four samples per 60 Hz cycle. The principle is proven by approximating the decaying DC current term by the first two terms in the exponential series (a ramp function) as described in greater detail below. The object of the cosine filter is to sum the DC component such that it sums to zero. This concept can be extended to higher sampling rates. The problem is to select the cosine filter offset angle such that the DC ramp input sums to zero. The present invention is directed to providing a novel, improved cosine filter.

SUMMARY OF THE INVENTION

Accordingly, a primary object of the present invention is to provide an improved cosine filter and protective relay utilizing the improved cosine filter. The invention is especially intended for protective relaying applications in which accurate voltage and current phasors must be derived.

A method or system for deriving a phasor representation of a current or voltage waveform in accordance with the present invention comprises the steps of, or means for, measuring time-domain samples (v(k), i(k)) of the waveform; computing, on the basis of the samples, a phasor representation of the waveform, the phasor representation being computed on the basis of a cosine filtering process; and performing a prescribed protective relaying function using the phasor. The prescribed relaying function may include, e.g., fault typing and/or fault location, although many other applications for phasors are known. In a preferred embodiment of the invention, the phasor representation is by a method comprising steps S1 through S5, as follows: (S1) applying an N-point cosine filter to a window of data points x(0), x(1), ... x(N−1), wherein the data points comprise measured and digitized current and/or voltage samples; (S2) applying an N/2-point cosine filter to the same window of data points, but using only odd-numbered points x(0), x(2), x(4), etc.; (S3) applying an N/4-point cosine filter to the same window of data points, using only a subset of the data points used in step S2; (S4) applying an N/8-point cosine filter to the same window of data points, using a subset of the data points used in step S3; and (S5) using a least squares fit to estimate the phasor.

Other features of the invention are disclosed below.

DETAILED DESCRIPTION OF PREFERRED EMBODIMENTS

Figure 1:
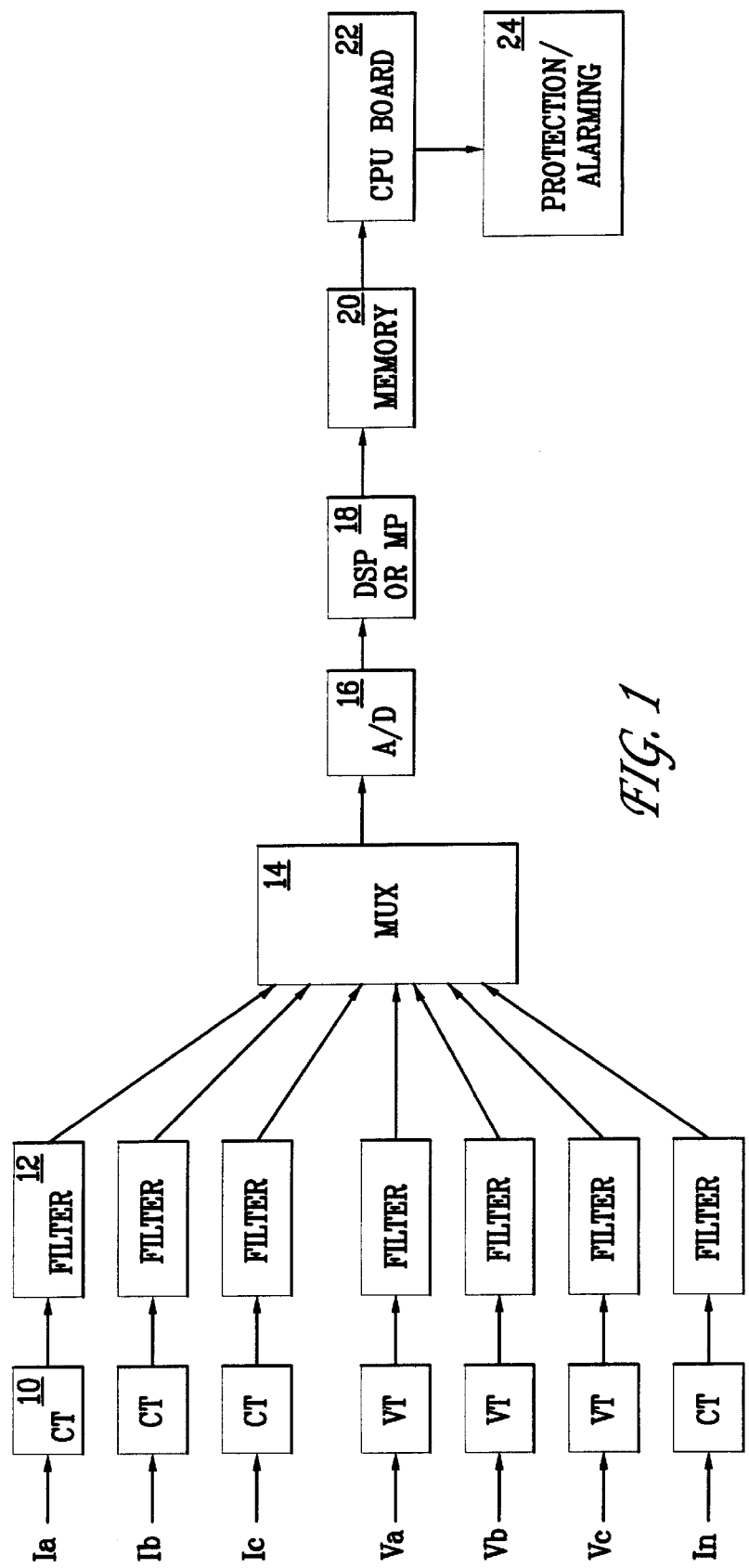
FIG. 1 schematically depicts a protective relay.

FIG. 1 depicts one presently preferred embodiment of a microprocessor-based protective relay in accordance with the present invention. As shown, the relay comprises current and voltage transducers 10, filters 12, and a multiplexor 14, the latter outputting an interleaved stream of analog phase current and voltage signal samples, as well as neutral current samples. The analog multiplex output by the multiplexor 14 is digitized by an analog-to-digital converter 16. The output of the analog-to-digital converter 16 is fed to a DSP 18. The DSP 18 employs a cosine filter, described below, to produce phasor data for each of the sampled channels. The phasor data is stored in a memory 20. The phasor data in the memory 20 is fed via a data bus to a central processing unit (CPU) board 22. The CPU board 22 includes a microprocessor, random access memory, and read only memory (ROM). The ROM contains program code controlling the microprocessor in performing fault typing, fault location, reporting, and other protective relaying functions. The random access memory may include a pre-fault segment of memory and a post-fault segment of memory, which may be employed (as described, e.g., in U.S. Pat. No. 5,428,549, Jun. 27, 1995, "Transmission Line Fault Location System") in performing the various protective relaying functions. The CPU board 22 may output fault data to a protection/alarming block 24 that performs protection and alarming functions such as tripping a circuit breaker or sounding an alarm as appropriate.

Figure 2:
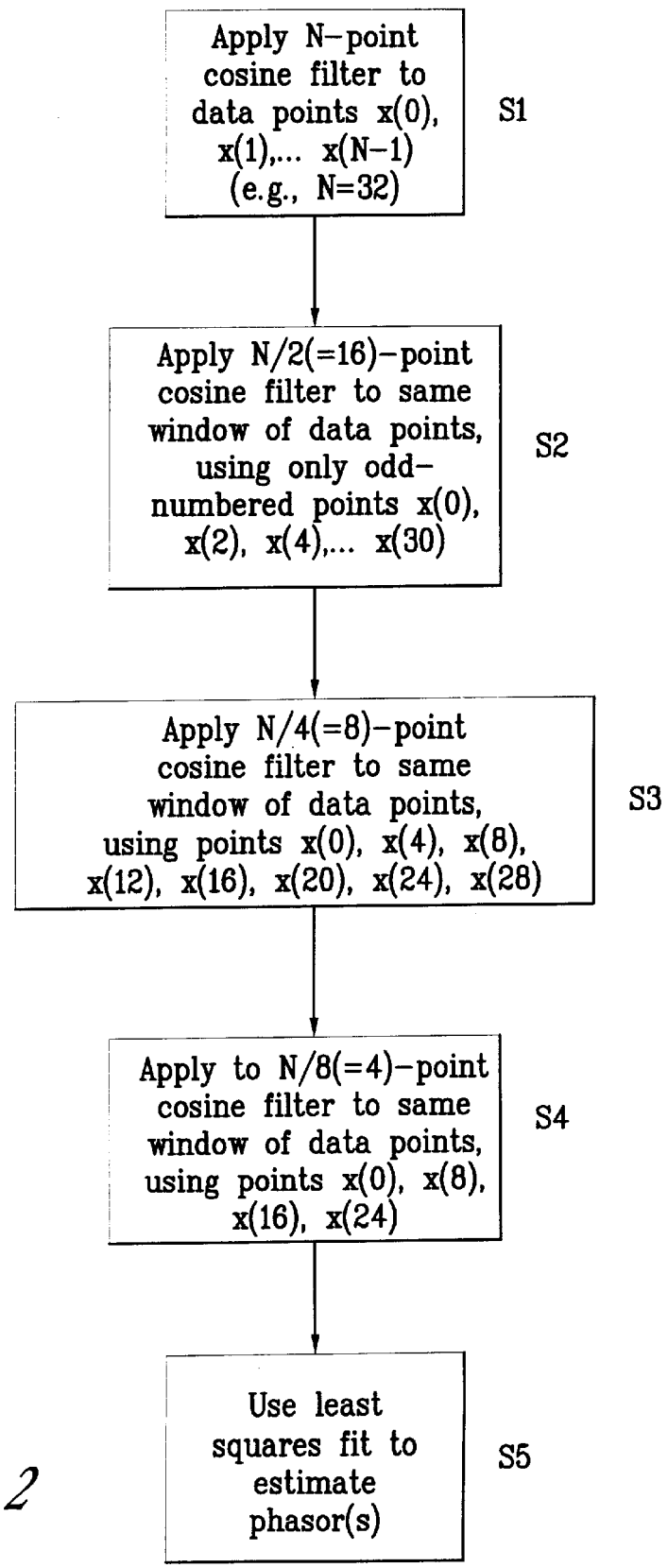
FIG. 2 is a flowchart of a cosine filtering process in accordance with the present invention.

FIG. 2 is a flowchart of a cosine filtering process or method in accordance with the present invention. As shown in FIG. 2, the presently preferred embodiment of the inventive process includes five steps, denoted S1 through S5, which may be summarized as follows: Step S1 involves the application of an N-point (e.g., 32-point) cosine filter to the data points x(0), x(1), . . . x(N-1), where the data points are the measured and digitized current and/or voltage samples. In step S2, an N/2-point cosine filter is applied to the same window of data points, but using only the odd-numbered points, e.g., the first point x(0), third point x(2), fifth point x(4), etc. Step S3 involves the application of an N/4-point cosine filter to the same window of data points, but now using only the first point x(0), fifth point x(4), ninth point x(8), etc.). Similarly, step S4 involves the application of an N/8-point cosine filter to the same window of data points. In this step, only the first point x(0), ninth point x(8), seventeenth point x(16) and twenty-fifth point x(24) are used. In step S5, a least squares fit is employed to estimate the desired phasor(s).

As mentioned, the purpose of the process is to reduce the effect of DC decaying transients on phasor estimates. This is done using a sub-window cosine filter, in which only selected points in the window are used. The invention provides a variation of the non-orthogonal filter, by which a phasor estimate is computed by using exactly a 32-point window. An important aspect of the sub-window cosine filter of the present invention is to repeat the basic cosine filter for only selected points of the window. For example, one can first start with the whole window to obtain a linear combination of $A\cos(\theta)$ and $A\sin(\theta)$. Next, a 16-point cosine filter is applied to the same window, using only the odd-numbered points, resulting in another combination of $A\cos(\theta)$ and $A\sin(\theta)$. Next, the even-numbered points are used, or an N-point cosine filter is applied to the window, where N is equal to 4 or 8. In the end, a least-squares fit is used to obtain an estimate for the phasor components. The whole process can be combined to yield a pair of 32-point FIR filters. Previous cosine techniques use a data window whose length is greater than 1 cycle while the present invention requires only 1 cycle.

The basic cosine filter has coefficients $$\left\{a_k = \frac{\sqrt{2}}{N} \cdot \cos\left(\frac{2\pi}{N}k + \delta\right)\right\}_{k=0}^{N-1}$$

where N is the number of samples per 60-Hz cycle and $\delta$ is an arbitrary angle. The objective is to compute $A\cos(\theta)$ and $A\sin(\theta)$. This requires that more equations be built based on a cycle-length window of data. Consider the case where N=32 points.

The following four equations represent the different numerical outputs when different subwindows are picked. For example, $Y(32,\pi/32)$ denotes the numerical output when the cosine filter is applied to a whole window (32 points), $Y(16,\pi/16)$ is the numerical output when the cosine filter is applied to only 16 points (points 0, 2, 4, . . . , 30), etc.

$$Y\left(32, \frac{\pi}{32}\right) = \left(\cos\frac{\pi}{32}\right)A\cos\theta + \left(\sin\frac{\pi}{32}\right)A\sin\theta$$

$$Y\left(16, \frac{\pi}{16}\right) = \left(\cos\frac{\pi}{16}\right)A\cos\theta + \left(\sin\frac{\pi}{16}\right)A\sin\theta$$

$$Y\left(8, \frac{\pi}{8}\right) = \left(\cos\frac{\pi}{8}\right)A\cos\theta + \left(\sin\frac{\pi}{8}\right)A\sin\theta$$

$$Y\left(4, \frac{\pi}{4}\right) = \left(\cos\frac{\pi}{4}\right)A\cos\theta + \left(\sin\frac{\pi}{4}\right)A\sin\theta$$

where,

The first row is due to applying the 32-point cosine filter to the data points {x(0), x(1), . . . , x(31)}.

The second row is due to applying the 16-point cosine filter to the data points {x(0), x(2), . . . , x(30)}.

The third row is due to applying the 8-point cosine filter to the data points {x(0), x(4), . . . , x(28)}

The fourth row is due to applying the 4-point cosine filter to the data points {x(0), x(8), x(16), x(24)}

These equations can be converted to matrix form:

$$\begin{bmatrix} \cos\frac{\pi}{32} & \sin\frac{\pi}{32} \\ \cos\frac{\pi}{16} & \sin\frac{\pi}{16} \\ \cos\frac{\pi}{8} & \sin\frac{\pi}{8} \\ \cos\frac{\pi}{4} & \sin\frac{\pi}{4} \end{bmatrix} \begin{pmatrix} A\cos\theta \\ A\sin\theta \end{pmatrix} = M\begin{pmatrix} A\cos\theta \\ A\sin\theta \end{pmatrix}$$

and $$\sum_{k=0}^{N-1} a_k x(k) = A\begin{pmatrix} x(0) \\ \vdots \\ x(31) \end{pmatrix}$$

where the matrix A has 4 rows and 32 columns and each row of A contains the coefficients of the various cosine filters. Zeros need to be inserted to proper places on rows 2, 3 and 4. On row 2, these places are 2,4,6, . . . ,32 (even numbered places); On row 3, these places are 2, 3, 4, 6, 7, 8, 10, 11, 12, 14, 10 15, 16, 18, 19, 20, 22, 23, 24, 26, 27, 28, 30, 31, 32. On row 4, these places are: 2 to 8, 10 to 16, 18 to 24, 26 to 32. Combining these equations, we obtain $$M\begin{pmatrix}A\cos\theta\\ A\sin\theta\end{pmatrix} = A\begin{pmatrix}x(0)\\ \vdots\\ x(31)\end{pmatrix}$$

A least squares estimation (LSE) yields:

$$\begin{pmatrix}A\cos\theta\\ A\sin\theta\end{pmatrix} = (M^T M)^{-1} M^T A \begin{pmatrix}x(0)\\ \vdots\\ x(31)\end{pmatrix}$$

The 2-by-32 matrix $(M^T M)^{-1} M^T A$ is a fixed matrix and can be easily computed prior to implementation in the protective relay. In other words, these equations provide a new "cosine" filter that yields the phasor by using a data window of exactly 1-cycle length.

Those skilled in the protective relaying art will recognize that there are a variety of uses for phasors of the kind yielded by the present invention. For example, phasors are used in power system protection (e.g., level detection (threshold units), direction discrimination, fault distance estimation, out of step detection, and fault location). Phasors are also used in the fields of power measurement (voltage, current and power metering), power flow analysis, state estimation, and power system control. Voltage and current phasors, e.g., are essential to carrying out many different calculation and decision making processes in the frequency domain. Since errors in the phasor calculations can result in erroneous decisions, it is important that the phasors used in the decision making process be accurate. The present invention provides such accurate phasors.

The above description of preferred embodiments of the invention is not intended to limit the scope of protection of the following claims. Thus, for example, except where they are expressly so limited, the claims are not limited to applications involving three-phase power systems or power systems employing a 60 Hz or 50 Hz fundamental frequency. Moreover, the claims are not limited to systems associated with any particular part (i.e., transformer, feeder, high power transmission line, etc.) of a power distribution system.

We claim:

1. A method for deriving a phasor representation of a current or voltage waveform on a power line, wherein said waveform includes a decaying DC component, comprising the steps of:

measuring time-domain samples (v(k), i(k)) of said waveform;

computing, on the basis of said samples, a phasor representation of said waveform, said phasor representation being computed on the basis of a cosine filtering process comprising steps S1 through S5, as follows:

(S1) applying an N-point cosine filter to a window of data points x(0), x(1), . . . x(N−1), wherein the data points comprise measured and digitized current and/or voltage samples;

(S2) applying an N/2-point cosine filter to the same window of data points, but using only odd-numbered points x(0), x(2), x(4), etc.;

(S3) applying an N/4-point cosine filter to the same window of data points, using only a subset of the data points used in step S2;

(S4) applying an N/8-point cosine filter to the same window of data points, using a subset of the data points used in step S3; and (S5) estimating the phasor; and performing a prescribed power system or protective relaying function using said phasor.

2. The method of claim 1, wherein step S5 is performed using a least squares fit.

3. The method of claim 1, wherein N=32.

4. A system for deriving a phasor representation of a current or voltage waveform on a transmission line, wherein said waveform includes a decaying DC component, comprising:

means for measuring time-domain samples (v(k), i(k)) of said waveform;

means for computing, on the basis of said samples, a phasor representation of said waveform, said phasor representation being computed on the basis of a cosine filtering process comprising steps S1 through S5, as follows:

(S1) applying an N-point cosine filter to a window of data points x(0), x(1), . . . x(N−1), wherein the data points comprise measured and digitized current and/or voltage samples;

(S2) applying an N/2-point cosine filter to the same window of data points, but using only odd-numbered points x(0), x(2), x(4), etc.;

(S3) applying an N/4-point cosine filter to the same window of data points, using only a subset of the data points used in step S2;

(S4) applying an N/8-point cosine filter to the same window of data points, using a subset of the data points used in step S3; and (S5) estimating the phasor; and means for performing a prescribed power system or protective relaying function using said phasor.

5. The system of claim 4, wherein said phasor is estimated, in step S5, by using a least squares fit.

6. The system of claim 4, wherein N=32.

* * * * *